(12) United States Patent
 Choi

(10) Patent No.: US 8,535,571 B2
(45) Date of Patent: Sep. 17, 2013

(54) WATER-SOLUBLE ELECTRICALLY CONDUCTIVE POLYMERS

(75) Inventor: Dong Hoon Choi, Seoul (KR)

(73) Assignee: Korea University Research and Business Foundation, Seoul (KR)

( * ) Notice: Subject to any disclaimer, the term of this patent is extended or adjusted under 35 U.S.C. 154(b) by 426 days.

(21) Appl. No.: 12/650,225

(22) Filed: Dec. 30, 2009

(65) Prior Publication Data
 US 2011/0155963 A1    Jun. 30, 2011

(51) Int. Cl.
 *B05D 5/00* (2006.01)
 *H01B 1/00* (2006.01)

(52) U.S. Cl.
 USPC ........... 252/510; 252/500; 252/502; 252/511; 427/58; 427/99.2; 427/99.4; 430/315; 438/758; 438/759; 438/765; 525/92 L

(58) Field of Classification Search
 USPC ......... 250/500–518.3; 106/287.23; 252/500, 252/502, 510, 511; 427/58, 99.2, 99.4; 430/315; 438/758, 759, 765; 525/92 L
 See application file for complete search history.

(56) References Cited

U.S. PATENT DOCUMENTS

| | | | |
|---|---|---|---|
| 5,111,327 A | 5/1992 | Blohm et al. | |
| 5,306,443 A * | 4/1994 | Kaneko et al. | 252/519.33 |
| 2003/0088032 A1* | 5/2003 | Luebben et al. | 525/410 |
| 2003/0139505 A1 | 7/2003 | Reuter et al. | |
| 2004/0162397 A1 | 8/2004 | Lee et al. | |
| 2005/0053801 A1* | 3/2005 | Elschner et al. | 428/690 |
| 2007/0176174 A1 | 8/2007 | Lee et al. | |
| 2008/0050534 A1 | 2/2008 | Louwet et al. | |
| 2008/0105854 A1 | 5/2008 | Huh et al. | |
| 2011/0001720 A1 | 1/2011 | Asai et al. | |

FOREIGN PATENT DOCUMENTS

| | | |
|---|---|---|
| EP | 0203438 A1 * | 12/1986 |
| KR | 1020020074633 | 10/2002 |
| KR | 1020070078595 | 8/2007 |
| KR | 1020090055737 | 6/2009 |
| WO | WO 03/054052 | 7/2003 |
| WO | WO 2007/066353 | 6/2007 |
| WO | WO 2008029933 | 3/2008 |
| WO | WO 2008/082662 | 7/2008 |

OTHER PUBLICATIONS

International Search Report and Written Opinion for International Application PCT/KR2010/009124 dated Mar. 30, 2011.
Kanoh, Y., "Glass Substrate for Solar Cells Will Grow 1,200% by 2012, Report Claims," accessed at http://techon.nikkeibp.co.jp/english/NEWS_EN/20080401/149864/, Apr. 1, 2008.
Kouno, K., "Nitta Denko Expanding Touch Screen—use Transparent Conductive Films Business," accessed at http://web.archive.org/web/20080509163043/http://www.nitto.com/company/release/07_04_06/index.html, Jul. 4, 2007, pp. 2.

* cited by examiner

*Primary Examiner* — Tri V Nguyen
(74) *Attorney, Agent, or Firm* — Workman Nydegger

(57) ABSTRACT

Water-soluble electrically conductive polymers and a composition comprising such polymers are provided. Also, an electrically conductive layer or film formed from the composition, and articles comprising the electrically conductive layer or film are provided. The electrically conductive polymers according to the present disclosure have one or more hydrophilic side chains. Hydrophilic side chains are covalently bonded to the conductive polymers, which allow the polymer to be stable at high temperature. Thus, the stability of electrical conductivity is prolonged. Depending on the concentration of hydrophilic side chains, the conductivity may be changed. The hydrophilic side chains provide a successful way to fabricate a ductile film exhibiting tunable conductivity. Furthermore, high levels of surface-resistance uniformity can be achieved in the field of coating technology that uses eco-friendly water-based solvents to uniformly and quickly coat the conductive polymer on to plastic film surfaces.

8 Claims, 1 Drawing Sheet

WATER-SOLUBLE ELECTRICALLY CONDUCTIVE POLYMERS

TECHNICAL FIELD

The present disclosure relates generally to techniques for producing water-soluble electrically conductive polymers.

BACKGROUND

Electrical conductivity is a useful property in transparent electrodes, electromagnetic wave shielding films, antistatic agents, solar cells and the like. Currently, electrical conductivity is achieved in transparent films by application of a thin metallic coating such as gold, silver or copper, or a metal oxide coating such as Indium Tin Oxide (ITO). Transparent conductive oxide films such as ITO are used in a wide variety of applications such as, but not limited to, window de-icers, heat reflectors, LCDs, OLEDs, solar cells, and architectural coatings. One feature of ITO coatings is that they tend to have weak mechanical strength and low flexibility, which makes them fragile and readily damaged during bending. In addition, ITO coatings are generally applied using vacuum deposition and are therefore not able to form patterns or circuits through wet processing. Also, the high raw material cost of indium and the chemical stability in some device structures limit potential applications.

SUMMARY

Water-soluble electrically conductive polymers and compositions including such polymers are provided. Also, an electrically conductive layer or film formed from the composition, and articles including the electrically conductive layer or film are provided. Also disclosed are methods for making electrically conductive layers or films and articles manufactured according to these methods.

In one embodiment, a polymer including at least one repeating unit of Formula 1 and Formula 2 is provided.

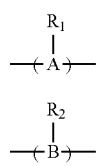

[Formula 1]

[Formula 2]

In Formulas 1 and 2, A and B are independently at least one member selected from the group phenylene, phenylene vinylene, pyrrolylene, pyrrolylene vinylene, thienylene, thienylene vinylene, fluorenylene, fluorenylene vinylene, furanylene, furanylene vinylene, phenothiazinylene, phenothiazinylene vinylene, phenazinylene, phenazinylene vinylene, phenoxazinylene and phenoxazinylene vinylene, which are unsubstituted or substituted with one or more substituents. The substituents are independently selected from the group hydroxyl, alkyl, alkenyl, alkynyl, alkanoyl, alkanoylamino, alkenoyl, alkynoyl, alkoxy, alkoxycarbonyl, alkoxycarbonylamino, alkylamino, alkylaminocarbonyl, dialkylaminocarbonyl, alkylsulfonyl, alkylsulfinyl, sulfonylaminoalkyl, alkylsulfonylaminocarbonyl, aminoalkyl, cyanoalkyl, halogen, haloalkyl, haloalkenyl, haloalkynyl, haloalkanoyl, haloalkenoyl, haloalkynoyl, haloalkoxy, haloalkoxycarbonyl, hydroxyalkyl, oxoalkyl, cycloalkyl, cycloalkenyl, cycloalkanoyl, cycloalkenoyl, cycloalkoxy, cycloalkoxycarbonyl, aryl, arylene, heterocycle, heterocyclyl, heteroaryl, heteroarylene, arylalkyl, heteroarylalkyl, arylalkanoyl, heteroarylalkanoyl, arylalkenoyl, heteroarylalkenoyl, arylalkynoyl, heteroarylalkynoyl, arylalkoxy, heteroarylalkoxy, aryloxy, heteroaryloxy, aryloxycarbonyl, heteroarylxoycarbonyl, arylalkoxycarbonyl, heteroarylalkoxycarbonyl, alkythio, alkylthioalkyl, arylthio, arylsulfonyl and arylsulfinyl. Or, the substituents together may form an alkylene or alkenylene chain completing a 3, 4, 5, 6, or 7-membered aromatic or alicyclic ring. The ring optionally includes one or more divalent nitrogen, sulfur or oxygen atoms; and the substituents may be substituted or unsubstituted.

In the foregoing Formulas, $R_1$ represents

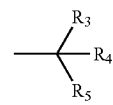

and $R_2$ represents

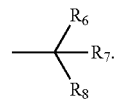

$R_3$, $R_4$, $R_5$, $R_6$, $R_7$ and $R_8$ are independently hydrogen, alkyl, ammonium or

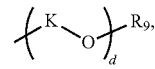

with the proviso that at least one of $R_3$, $R_4$, $R_5$, $R_6$, $R_7$ and $R_8$ is ammonium or

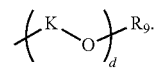

In the Formulas, K may represent alkylene having one or two carbon and d is 1 to 3. In the Formulas, $R_9$ may be hydroxyl, carboxylic acid, sulfonic acid, or a straight or branched alkyl which is unsubstituted or substituted with hydroxyl. In the Formulas, the polymer has a degree of polymerization of 100 to 1,000. In one embodiment a method for manufacturing an electrically conductive layer or film of an electronic device is disclosed. The method may include forming an intermediate composition including a solvent and an electrically conductive polymer, the polymer including at least one repeating unit of Formula 1 and Formula 2 as described above. The method also includes applying the intermediate composition to a substrate and removing at least a portion of the solvent to yield the electrically conductive layer or film. The solvent may be an aqueous solvent such as, but not limited to, water and optionally an alcohol.

DETAILED DESCRIPTION

Figure 1:
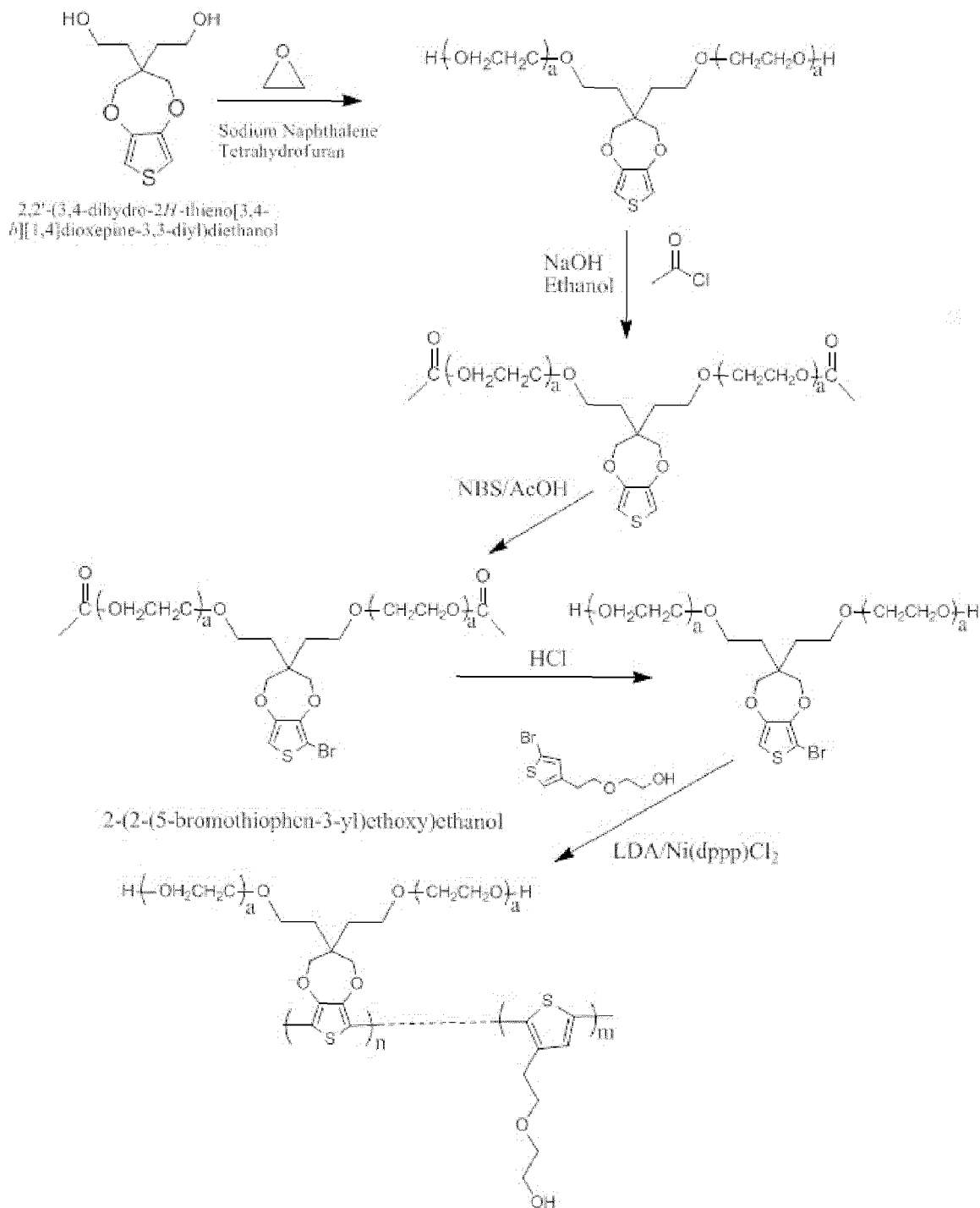
FIG. 1 illustrates a scheme for preparing an electrically conductive polymer having hydrophilic side chains.

The illustrative embodiments described in the detailed description and claims are not meant to be limiting. Other embodiments may be utilized, and other changes may be made, without departing from the spirit or scope of the subject matter presented herein. It will be readily understood that the aspects of the present disclosure, as generally described herein, can be arranged, substituted, combined, separated, and designed in a wide variety of different configurations, all of which are explicitly contemplated herein.

Water-soluble electrically conductive polymers and compositions including such polymers are provided. The polymers include two or more electrically conductive monomers. At least one of the two monomers includes a hydrophilic group that allows the electrically conductive polymer to have a desired solubility in aqueous solutions. The ratios of the electrically conductive monomers can be selected (i.e., tuned) to optimize water solubility and electrical conductance. The electrically conductive polymers may be used to make layers and/or films on a substrate. For example, the electrically conductive layers may be used to manufacture features of an electrical device. The water solubility of the electrically conductive polymers allows methods to be performed to manufacture components of an electronic device.

Unless otherwise indicated, this disclosure uses the definitions provided below. Some of the definitions and formulae may include a dash ("-") to indicate a bond between atoms or a point of attachment to a named or unnamed atom or group of atoms. Other definitions and formulae may include an equal sign ("=") or an identity symbol ("≡") to indicate a double bond or a triple bond, respectively.

"Substituted" groups are those in which one or more hydrogen atoms have been replaced with one or more non-hydrogen groups, provided that valence requirements are met and that a chemically stable compound results from the substitution.

"Alkyl" refers to straight chain and branched saturated hydrocarbon groups, generally having a specified number of carbon atoms (i.e., $C_{1-6}$ alkyl refers to an alkyl group having 1, 2, 3, 4, 5, or 6 carbon atoms and $C_{1-12}$ alkyl refers to an alkyl group having 1, 2, 3, 4, 5, 6, 7, 8, 9, 10, 11, or 12 carbon atoms). Examples of alkyl groups include, without limitation, methyl, ethyl, n-propyl, i-propyl, n-butyl, s-butyl, i-butyl, t-butyl, pent-1-yl, pent-2-yl, pent-3-yl, 3-methylbut-1-yl, 3-methylbut-2-yl, 2-methylbut-2-yl, 2,2,2-trimethyleth-1-yl, n-hexyl, and the like.

"Alkenyl" refers to straight chain and branched hydrocarbon groups having one or more unsaturated carbon-carbon bonds, and generally having a specified number of carbon atoms. Examples of alkenyl groups include, without limitation, ethenyl, 1-propen-1-yl, 1-propen-2-yl, 2-propen-1-yl, 1-buten-1-yl, 1-buten-2-yl, 3-buten-1-yl, 3-buten-2-yl, 2-buten-1-yl, 2-buten-2-yl, 2-methyl-1-propen-1-yl, 2-methyl-2-propen-1-yl, 1,3-butadien-1-yl, 1,3-butadien-2-yl, and the like.

"Alkynyl" refers to straight chain or branched hydrocarbon groups having one or more triple carbon-carbon bonds, and generally having a specified number of carbon atoms. Examples of alkynyl groups include, without limitation, ethynyl, 1-propyn-1-yl, 2-propyn-1-yl, 1-butyn-1-yl, 3-butyn-1-yl, 3-butyn-2-yl, 2-butyn-1-yl, and the like.

"Alkanoyl" and "alkanoylamino" refer, respectively, to alkyl-C(O)— and alkyl-C(O)—NH—, where alkyl is defined above, and generally includes a specified number of carbon atoms, including the carbonyl carbon. Examples of alkanoyl groups include, without limitation, formyl, acetyl, propionyl, butyryl, pentanoyl, hexanoyl, and the like.

"Alkenoyl" and "alkynoyl" refer, respectively, to alkenyl-C(O)— and alkynyl-C(O)—, where alkenyl and alkynyl are defined above. References to alkenoyl and alkynoyl generally include a specified number of carbon atoms, excluding the carbonyl carbon. Examples of alkenoyl groups include, without limitation, propenoyl, 2-methylpropenoyl, 2-butenoyl, 3-butenoyl, 2-methyl-2-butenoyl, 2-methyl-3-butenoyl, 3-methyl-3-butenoyl, 2-pentenoyl, 3-pentenoyl, 4-pentenoyl, and the like. Examples of alkynoyl groups include, without limitation, propynoyl, 2-butynoyl, 3-butynoyl, 2-pentynoyl, 3-pentynoyl, 4-pentynoyl, and the like.

"Alkoxy," "alkoxycarbonyl," and "alkoxycarbonylamino," refer, respectively, to alkyl-O—, alkenyl-O, and alkynyl-O; to alkyl-O—C(O)—, alkynyl-O—C(O)—; and to alkyl-O—C(O)—NH—, and alkynyl-O—C(O)—NH—, where alkyl, alkenyl, and alkynyl are defined above. Examples of alkoxy groups include, without limitation, methoxy, ethoxy, n-propoxy, i-propoxy, n-butoxy, s-butoxy, t-butoxy, n-pentoxy, s-pentoxy, and the like. Examples of alkoxycarbonyl groups include, without limitation, methoxycarbonyl, ethoxycarbonyl, n-propoxycarbonyl, i-propoxycarbonyl, n-butoxycarbonyl, s-butoxycarbonyl, t-butoxycarbonyl, n-pentoxycarbonyl, s-pentoxycarbonyl, and the like.

"Alkylamino," "alkylaminocarbonyl," "dialkylaminocarbonyl," "alkylsulfonyl," "alkylsulfinyl," "sulfonylaminoalkyl," and "alkylsulfonylaminocarbonyl" refer, respectively, to alkyl-NH—, alkyl-NH—C(O)—, $alkyl_2$-N—C(O)—, alkyl-S($O_2$)—, alkyl-S(=O)—, $HS(O_2)$—NH-alkyl-, and alkyl-S(O)—NH—C(O)—, where alkyl is defined above.

"Aminoalkyl" and "cyanoalkyl" refer, respectively, to $NH_2$-alkyl and N≡C-alkyl, where alkyl is defined above.

"Halo," "halogen" and "halogeno" may be used interchangeably, and refer to fluoro, chloro, bromo, and iodo.

"Haloalkyl," "haloalkenyl," "haloalkynyl," "haloalkanoyl," "haloalkenoyl," "haloalkynoyl," "haloalkoxy," and "haloalkoxycarbonyl" refer, respectively, to alkyl, alkenyl, alkynyl, alkanoyl, alkenoyl, alkynoyl, alkoxy, and alkoxycarbonyl groups substituted with one or more halogen atoms, where alkyl, alkenyl, alkynyl, alkanoyl, alkenoyl, alkynoyl, alkoxy, and alkoxycarbonyl are defined above. Examples of haloalkyl groups include, without limitation, trifluoromethyl, trichloromethyl, pentafluoroethyl, pentachloroethyl, and the like.

"Hydroxyalkyl" and "oxoalkyl" refer, respectively, to HO-alkyl and O=alkyl, where alkyl is defined above. Examples of hydroxyalkyl and oxoalkyl groups include, without limitation, hydroxymethyl, hydroxyethyl, 3-hydroxypropyl, oxomethyl, oxoethyl, 3-oxopropyl, and the like.

"Cycloalkyl" refers to saturated monocyclic and bicyclic hydrocarbon rings, generally having a specified number of carbon atoms that comprise the ring (i.e., C3-7 cycloalkyl refers to a cycloalkyl group having 3, 4, 5, 6 or 7 carbon atoms as ring members). The cycloalkyl may be attached to a parent group or to a substrate at any ring atom, unless such attachment would violate valence requirements. Likewise, the cycloalkyl groups may include one or more non-hydrogen substituents unless such substitution would violate valence requirements.

Examples of monocyclic cycloalkyl groups include, without limitation, cyclopropyl, cyclobutyl, cyclopentyl, cyclohexyl, and the like. Examples of bicyclic cycloalkyl groups include, without limitation, bicyclo[1.1.0]butyl, bicyclo[1.1.1]pentyl, bicyclo[2.1.0]pentyl, bicyclo[2.1.1]hexyl, bicyclo[3.1.0]hexyl, bicyclo[2.2.1]heptyl, bicyclo[3.2.0] heptyl, bicyclo[3.1.1]heptyl, bicyclo[4.1.0]heptyl, bicyclo

[2.2.2]octyl, bicyclo[3.2.1]octyl, bicyclo[4.1.1]octyl, bicyclo[3.3.0]octyl, bicyclo[4.2.0]octyl, bicyclo[3.3.1]nonyl, bicyclo[4.2.1]nonyl, bicyclo[4.3.0]nonyl, bicyclo[3.3.2]decyl, bicyclo[4.2.2]decyl, bicyclo[4.3.1]decyl, bicyclo[4.4.0]decyl, bicyclo[3.3.3]undecyl, bicyclo[4.3.2]undecyl, bicyclo[4.3.3]dodecyl, and the like, which may be attached to a parent group or substrate at any of the ring atoms, unless such attachment would violate valence requirements.

"Cycloalkenyl" refers to monocyclic and bicyclic hydrocarbon rings having one or more unsaturated carbon-carbon bonds and generally having a specified number of carbon atoms that comprise the ring (i.e., C3-7 cycloalkenyl refers to a cycloalkenyl group having 3, 4, 5, 6 or 7 carbon atoms as ring members). The cycloalkenyl may be attached to a parent group or to a substrate at any ring atom, unless such attachment would violate valence requirements.

Likewise, the cycloalkenyl groups may include one or more non-hydrogen substituents unless such substitution would violate valence requirements. Useful substituents include, without limitation, alkyl, alkenyl, alkynyl, haloalkyl, haloalkenyl, haloalkynyl, alkoxy, alkoxycarbonyl, alkanoyl, and halo, as defined above, and hydroxy, mercapto, nitro, and amino.

"Cycloalkanoyl" and "cycloalkenoyl" refer to cycloalkyl-C(O)— and cycloalkenyl-C(O)—, respectively, where cycloalkyl and cycloalkenyl are defined above. References to cycloalkanoyl and cycloalkenoyl generally include a specified number of carbon atoms, excluding the carbonyl carbon. Examples of cycloalkanoyl groups include, without limitation, cyclopropanoyl, cyclobutanoyl, cyclopentanoyl, cyclohexanoyl, cycloheptanoyl, 1-cyclobutenoyl, 2-cyclobutenoyl, 1-cyclopentenoyl, 2-cyclopentenoyl, 3-cyclopentenoyl, 1-cyclohexenoyl, 2-cyclohexenoyl, 3-cyclohexenoyl, and the like.

"Cycloalkoxy" and "cycloalkoxycarbonyl" refer, respectively, to cycloalkyl-O— and cycloalkenyl-O, and to cycloalkyl-O—C(O)— and cycloalkenyl-O—C(O)—, where cycloalkyl and cycloalkenyl are defined above. References to cycloalkoxy and cycloalkoxycarbonyl generally include a specified number of carbon atoms, excluding the carbonyl carbon.

Examples of cycloalkoxy groups include, without limitation, cyclopropoxy, cyclobutoxy, cyclopentoxy, cyclohexoxy, 1-cyclobutenoxy, 2-cyclobutenoxy, 1-cyclopentenoxy, 2-cyclopentenoxy, 3-cyclopentenoxy, 1-cyclohexenoxy, 2-cyclohexenoxy, 3-cyclohexenoxy, and the like. Examples of cycloalkoxycarbonyl groups include, without limitation, cyclopropoxycarbonyl, cyclobutoxycarbonyl, cyclopentoxycarbonyl, cyclohexoxycarbonyl, 1-cyclobutenoxycarbonyl, 2-cyclobutenoxycarbonyl, 1-cyclopentenoxycarbonyl, 2-cyclopentenoxycarbonyl, 3-cyclopentenoxycarbonyl, 1-cyclohexenoxycarbonyl, 2-cyclohexenoxycarbonyl, 3-cyclohexenoxycarbonyl, and the like.

"Aryl" and "arylene" refer to monovalent and divalent aromatic groups, respectively, including 5- and 6-membered monocyclic aromatic groups that contain 0 to 4 heteroatoms independently selected from nitrogen, oxygen, and sulfur. Examples of monocyclic aryl groups include, without limitation, phenyl, pyrrolyl, furanyl, thiopheneyl, thiazolyl, isothiazolyl, imidazolyl, triazolyl, tetrazolyl, pyrazolyl, oxazolyl, isooxazolyl, pyridinyl, pyrazinyl, pyridazinyl, pyrimidinyl, and the like. Aryl and arylene groups also include bicyclic groups, tricyclic groups, etc., including fused 5- and 6-membered rings as described above. Examples of multicyclic aryl groups include, without limitation, naphthyl, biphenyl, anthracenyl, pyrenyl, carbazolyl, benzoxazolyl, benzodioxazolyl, benzothiazolyl, benzoimidazolyl, benzothiopheneyl, quinolinyl, isoquinolinyl, indolyl, benzofuranyl, purinyl, indolizinyl, and the like. The aryl and arylene groups may be attached to a parent group or to a substrate at any ring atom, unless such attachment would violate valence requirements.

Likewise, aryl and arylene groups may include one or more non-hydrogen substituents unless such substitution would violate valence requirements. Useful substituents include, without limitation, alkyl, alkenyl, alkynyl, haloalkyl, haloalkenyl, haloalkynyl, cycloalkyl, cycloalkenyl, alkoxy, cycloalkoxy, alkanoyl, cycloalkanoyl, cycloalkenoyl, alkoxycarbonyl, cycloalkoxycarbonyl, and halo, as defined above, and hydroxy, mercapto, nitro, amino, and alkylamino.

"Heterocycle" and "heterocyclyl" refer to saturated, partially unsaturated, or unsaturated monocyclic or bicyclic rings having from 5 to 7 or from 7 to 11 ring members, respectively. These groups have ring members made up of carbon atoms and from 1 to 4 heteroatoms that are independently nitrogen, oxygen or sulfur, and may include any bicyclic group in which any of the above-defined monocyclic heterocycles are fused to a benzene ring. The nitrogen and sulfur heteroatoms may optionally be oxidized. The heterocyclic ring may be attached to a parent group or to a substrate at any heteroatom or carbon atom unless such attachment would violate valence requirements. Likewise, any of the carbon or nitrogen ring members may include a non-hydrogen substituent unless such substitution would violate valence requirements. Useful substituents include, without limitation, alkyl, alkenyl, alkynyl, haloalkyl, haloalkenyl, haloalkynyl, cycloalkyl, cycloalkenyl, alkoxy, cycloalkoxy, alkanoyl, cycloalkanoyl, cycloalkenoyl, alkoxycarbonyl, cycloalkoxycarbonyl, and halo, as defined above, and hydroxy, mercapto, nitro, amino, and alkylamino.

Examples of heterocycles include, without limitation, acridinyl, azocinyl, benzimidazolyl, benzofuranyl, benzothiofuranyl, benzothiophenyl, benzoxazolyl, benzthiazolyl, benztriazolyl, benztetrazolyl, benzisoxazolyl, benzisothiazolyl, benzimidazolinyl, carbazolyl, 4aH-carbazolyl, carbolinyl, chromanyl, chromenyl, cinnolinyl, decahydroquinolinyl, 2H, 6H-1,5,2-dithiazinyl, dihydrofuro[2,3-b]tetrahydrofuran, furanyl, furazanyl, imidazolidinyl, imidazolinyl, imidazolyl, 1H-indazolyl, indolenyl, indolinyl, indolizinyl, indolyl, 3H-indolyl, isobenzofuranyl, isochromanyl, isoindazolyl, isoindolinyl, isoindolyl, isoquinolinyl, isothiazolyl, isoxazolyl, morpholinyl, naphthyridinyl, octahydroisoquinolinyl, oxadiazolyl, 1,2,3-oxadiazolyl, 1,2,4-oxadiazolyl, 1,2,5-oxadiazolyl, 1,3,4-oxadiazolyl, oxazolidinyl, oxazolyl, oxazolidinyl, pyrimidinyl, phenanthridinyl, phenanthrolinyl, phenazinyl, phenothiazinyl, phenoxathiinyl, phenoxazinyl, phthalazinyl, piperazinyl, piperidinyl, pteridinyl, purinyl, pyranyl, pyrazinyl, pyrazolidinyl, pyrazolinyl, pyrazolyl, pyridazinyl, pyridooxazole, pyridoimidazole, pyridothiazole, pyridinyl, pyridyl, pyrimidinyl, pyrrolidinyl, pyrrolinyl, 2H-pyrrolyl, pyrrolyl, quinazolinyl, quinolinyl, 4H-quinolizinyl, quinoxalinyl, quinuclidinyl, tetrahydrofuranyl, tetrahydroisoquinolinyl, tetrahydroquinolinyl, 6H-1,2,5-thiadiazinyl, 1,2,3-thiadiazolyl, 1,2,4-thiadiazolyl, 1,2,5-thiadiazolyl, 1,3,4-thiadiazolyl, thianthrenyl, thiazolyl, thienyl, thienothiazolyl, thienooxazolyl, thienoimidazolyl, thiophenyl, triazinyl, 1,2,3-triazolyl, 1,2,4-triazolyl, 1,2,5-triazolyl, 1,3,4-triazolyl, and xanthenyl.

"Heteroaryl" and "heteroarylene" refer, respectively, to monovalent and divalent heterocycles or heterocyclyl groups, as defined above, which are aromatic. Heteroaryl and heteroarylene groups represent a subset of aryl and arylene groups, respectively.

"Arylalkyl" and "heteroarylalkyl" refer, respectively, to aryl-alkyl and heteroaryl-alkyl, where aryl, heteroaryl, and alkyl are defined above. Examples include, without limitation, benzyl, fluorenylmethyl, imidazol-2-yl-methyl, and the like.

"Arylalkanoyl," "heteroarylalkanoyl," "arylalkenoyl," "heteroarylalkenoyl," "arylalkynoyl," and "heteroarylalkynoyl" refer, respectively, to aryl-alkanoyl, heteroaryl-alkanoyl, aryl-alkenoyl, heteroaryl-alkenoyl, aryl-alkynoyl, and heteroaryl-alkynoyl, where aryl, heteroaryl, alkanoyl, alkenoyl, and alkynoyl are defined above. Examples include, without limitation, benzoyl, benzylcarbonyl, fluorenoyl, fluorenylmethylcarbonyl, imidazol-2-oyl, imidazol-2-yl-methylcarbonyl, phenylethenecarbonyl, 1-phenylethenecarbonyl, 1-phenyl-propenecarbonyl, 2-phenyl-propenecarbonyl, 3-phenyl-propenecarbonyl, imidazol-2-yl-ethenecarbonyl, 1-(imidazol-2-yl)-ethenecarbonyl, 1-(imidazol-2-yl)-propenecarbonyl, 2-(imidazol-2-yl)-propenecarbonyl, 3-(imidazol-2-yl)-propenecarbonyl, phenylethynecarbonyl, phenylpropynecarbonyl, (imidazol-2-yl)-ethynecarbonyl, (imidazol-2-yl)-propynecarbonyl, and the like.

"Arylalkoxy" and "heteroarylalkoxy" refer, respectively, to aryl-alkoxy and heteroaryl-alkoxy, where aryl, heteroaryl, and alkoxy are defined above. Examples include, without limitation, benzyloxy, fluorenylmethyloxy, imidazol-2-yl-methyloxy, and the like.

"Aryloxy" and "heteroaryloxy" refer, respectively, to aryl-O— and heteroaryl-O—, where aryl and heteroaryl are defined above. Examples include, without limitation, phenoxy, imidazol-2-yloxy, and the like.

"Aryloxycarbonyl," "heteroaryloxycarbonyl," "arylalkoxycarbonyl," and "heteroarylalkoxycarbonyl" refer, respectively, to aryloxy-C(O)—, arylalkoxy-C(O)—, heteroarylalkoxy-C(O)—, where aryloxy, heteroaryloxy, arylalkoxy, and heteroarylalkoxy are defined above. Examples include, without limitation, phenoxycarbonyl, imidazol-2-yloxycarbonyl, benzyloxycarbonyl, fluorenylmethyloxycarbonyl, imidazol-2-yl-methyloxycarbonyl, and the like.

"alkylthio," "alkylthioalkyl," and "arylthio," refer, respectively, to —S-alkyl, alkyl substituted with alkylthio, and —S-aryl, where alyl and aryl are defined above.

"arylsulfonyl" and "arylsulfinyl" refer, respectively, to aryl-S(O$_2$)— and aryl-S(=O)—, where aryl is defined above.

Poly(3,4-ethylenedioxythiophene)poly(styrenesulfonate) [PEDOT:PSS] is an example of an electrically conductive polymer that can be modified according to embodiments described herein.

In the present disclosure, water-soluble electrically conductive polymers and a composition including such polymers are provided. The electrically conductive polymers according to the present disclosure have one or more hydrophilic side chains. Hydrophilic side chains are covalently bonded to the conductive polymers, which allow the polymer to be stable at high temperature. The covalently bound hydrophilic side chains of the polymers do not evaporate like dopants used to make traditional [PEDOT:PSS] materials. Thus, in some embodiments of electrically conductive polymers described herein, the polymers are more soluble and/or more stable compared to known [PEDOT:PSS] polymers.

The concentration of hydrophilic side chains present on one or more of the monomer units of the conductivity polymers described herein may be changed. In one embodiment, the concentration may be changed by adjusting the ratio of one or more first electrically conductive monomer that includes hydrophilic side chains to one or more second electrically conductive monomers that do not include hydrophilic side chains. Through hydrogen bonding with the hydrophilic side chains, a trace amount of water can be born in the matrix. Water molecules and hydrophilic side chains can play a role in facilitating electron transport in the matrix of the electrically conductive polymers.

Aqueous solutions of the first and second electrically conductive monomers can be used to manufacture electrically conductive polymers having a desired ratio of monomers so as to impart a desired solubility and/or desired conductivity. For example, a solution with a particular concentration of one or more first monomers having hydrophilic side groups can be mixed with a solution with a particular concentration of one or more second monomers that do not have hydrophilic side chains to achieve a desired ratio of first monomers to second monomers.

Electrically conductive polymers manufactured according to the methods described herein can facilitate fabrication of a ductile film exhibiting tunable conductivity. Furthermore, high levels of surface-resistance uniformity can be achieved in the field of coating technology that uses eco-friendly water-based solvents to relatively uniformly and quickly coat the conductive polymer onto substrates, such as, but not limited to plastic film surfaces, such as polycarbonate, polyethylene terephthalate (PET) or polyethylene naphthalate (PEN). Other substrates, such as patterned or planar semiconductor substrates may also be used.

In one embodiment, such an electrically conductive polymer is a polymer including at least one repeating unit of Formula 1 and Formula 2:

In Formulas 1 and 2, A and B are independently at least one member selected from the group including phenylene, phenylene vinylene, pyrrolylene, pyrrolylene vinylene, thienylene, thienylene vinylene, fluorenylene, fluorenylene vinylene, furanylene, furanylene vinylene, phenothiazinylene, phenothiazinylene vinylene, phenazinylene, phenazinylene vinylene, phenoxazinylene and phenoxazinylene vinylene, which are unsubstituted or substituted with one or more substituents. The substituents are independently selected from the group including hydroxyl, alkyl, alkenyl, alkynyl, alkanoyl, alkanoylamino, alkenoyl, alkynoyl, alkoxy, alkoxycarbonyl, alkoxycarbonylamino, alkylamino, alkylaminocarbonyl, dialkylaminocarbonyl, alkylsulfonyl, alkylsulfinyl, sulfonylaminoalkyl, alkylsulfonylaminocarbonyl, aminoalkyl, cyanoalkyl, halogen, haloalkyl, haloalkenyl, haloalkynyl, haloalkanoyl, haloalkenoyl, haloalkynoyl, haloalkoxy, haloalkoxycarbonyl, hydroxyalkyl, oxoalkyl, cycloalkyl, cycloalkenyl, cycloalkanoyl, cycloalkenoyl, cycloalkoxy, cycloalkoxycarbonyl, aryl, arylene, heterocycle, heterocyclyl, heteroaryl, heteroarylene, arylalkyl, heteroarylalkyl, arylalkanoyl, heteroarylalkanoyl, arylalkenoyl, heteroarylalkenoyl, arylalkynoyl, heteroarylalkynoyl, arylalkoxy, heteroarylalkoxy, aryloxy, heteroaryloxy, aryloxycarbonyl, heteroarylxoycarbonyl, arylalkoxycarbonyl, heteroarylalkoxycarbonyl, alkythio, alkylthioalkyl, arylthio, arylsulfonyl and arylsulfinyl. Or, the substituents together may form an alkylene or alkenylene chain completing a 3, 4, 5, 6, or 7-membered aromatic or alicyclic ring. The ring may optionally include one or more divalent nitrogen, sulfur or oxygen atoms and the substituents may be further substituted or unsubstituted. In Formulas 1 and 2, $R_1$ represents

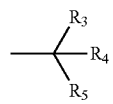

and $R_2$ represents

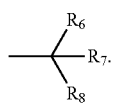

In Formulas 1 and 2, $R_3$, $R_4$, $R_5$, $R_6$, $R_7$ and $R_8$ are independently hydrogen, alkyl, ammonium or

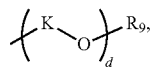

with the proviso that at least one of $R_3$, $R_4$, $R_5$, $R_6$, $R_7$ and $R_8$ is ammonium or

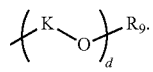

In Formulas 1 and 2, K represents alkylene having one or two carbon atoms and d is 1 to 3. In Formulas 1 and 2, $R_9$ is hydroxyl, carboxylic acid, sulfonic acid, or a straight or branched alkyl which is unsubstituted or substituted with hydroxyl. The polymer has a degree of polymerization of 100 to 1,000.

In Formulas 1 and 2, A and B are not limited to the exemplified monomers, and any monomer electrically conductive polymers can be used. A and B may be unsubstituted or substituted monomers which include electrically conductive polymers, and if any, the substituent can be further substituted with the above defined substituent. A and B may be the same or different monomers.

Typically, at least one of $R_3$, $R_4$, $R_5$, $R_6$, $R_7$ and $R_8$ is

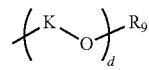

which represents a hydrophilic side chain. In the terminus of hydrophilic side chains, there are hydrophilic groups such as hydroxyl, carboxylic acid, sulfonic acid, or a straight or branched alkyl which is unsubstituted or substituted with hydroxyl. The hydrophilic groups increase hydrogen bonds between the polymer and water, thereby increasing water-solubility. The hydrophilic side chain can be comprised in either the repeating unit of formula 1 or the repeating unit of formula 2, or both of them. In order to easily control the concentration of the hydrophilic side chains, the hydrophilic side chain may be comprised in only one of the repeating unit of formula 1 and the repeating unit of formula 2.

Although the hydrophilic side chain can provide more water-solubility, if the hydrophilic side chain is too large, the conductivity may decrease. Therefore, the ratio of the repeating unit comprising the hydrophilic side chain in the polymer may be adjusted to optimize or tune electrical conductivity. Also, in order to increase electrically conductivity, a monomer with higher conductivity can be comprised in the polymer in a large ratio. Considering the conductivity of monomers and the presence of hydrophilic side chain in the electrically conductive polymer, the ratio of the repeating unit of formula 1 and the repeating unit of formula 2 can be controlled, for example, in the range of 0.1:1 to 10:1.

Moreover, the ratio of the repeating unit comprising the hydrophilic side chains may be varied depending on the concentration of the hydrophilic side chains in the repeating unit. As the concentration of the hydrophilic side chains increases, the conductivity may decrease. Therefore, the control of the ratio of the repeating unit comprising the hydrophilic side chains and the concentration of hydrophilic side chains allows polymers with tunable conductivity to be prepared.

In one embodiment, the repeating unit of Formula 1 and the repeating unit of Formula 2 are independently represented by Formula 3, Formula 4, or Formula 5.

[Formula 3]

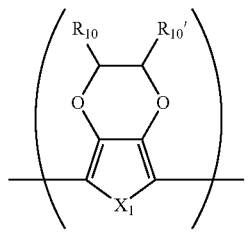

[Formula 4]

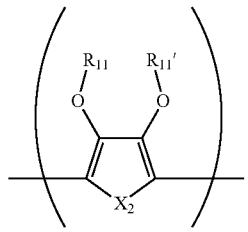

[Formula 5]

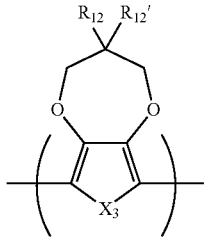

In Formulas 3-5, $X_1$, $X_2$ and $X_3$ are independently NH, O, S, or PH and $R_{10}$, $R_{10'}$, $R_{11}$, $R_{11'}$, $R_{12}$, and $R_{12'}$ independently represent

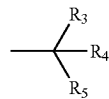

and

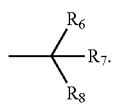

In Formulas 3-5, $R_3$, $R_4$, $R_5$, $R_6$, $R_7$, and $R_8$ are independently hydrogen, alkyl, ammonium or

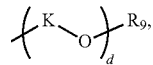

with the proviso that at least one of $R_3$, $R_4$, $R_5$, $R_6$, $R_7$ and $R_8$ is ammonium or

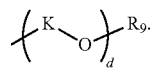

In Formulas 3-5, K represents alkylene having one or two carbon atoms and d is 1 to 3. In Formulas 3-5, $R_9$ is hydroxyl, carboxylic acid, sulfonic acid, or a straight or branched alkyl which is unsubstituted or substituted with hydroxyl. The polymer has a degree of polymerization of 100 to 1,000.

In another embodiment, $X_1$, $X_2$ and $X_3$ are independently S and $R_{10}$, $R_{10'}$, $R_{11}$, $R_{11'}$, $R_{12}$ and $R_{12'}$ independently represent

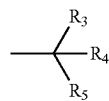

and

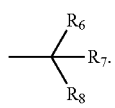

In this embodiment, $R_3$, $R_4$, $R_5$, $R_6$, $R_7$ and $R_8$ are independently hydrogen, alkyl, ammonium or

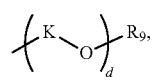

with the proviso that at least one of $R_3$, $R_4$, $R_5$, $R_6$, $R_7$ and $R_8$ is ammonium or

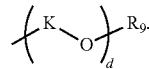

In this embodiment, K represents alkylene having one or two carbon atoms and d is 1 to 3. $R_9$ is hydroxyl, carboxylic acid, sulfonic acid, or a straight or branched alkyl which is unsubstituted or substituted with hydroxyl. The polymer has a degree of polymerization of 100 to 1,000.

In yet another embodiment, $R_3$, $R_4$, and $R_5$ are independently hydrogen, alkyl, ammonium or

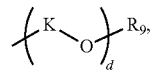

with the proviso that at least one of $R_3$, $R_4$ and $R_5$, is ammonium or

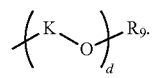

In this embodiment, K represents alkylene having one or two carbon atoms and d is 1 to 3. $R_9$ is hydroxyl, carboxylic acid, sulfonic acid, or a straight or branched alkyl which is unsubstituted or substituted with hydroxyl and $R_6$, $R_7$ and $R_8$ are independently hydrogen or alkyl.

In any of the foregoing formulas, polymeric acids or any Lewis acids can be used as electron acceptors.

A composition including a polymer according to the present disclosure is also provided. To fabricate a conductive film or layer using a conductive polymer of the present disclosure, the conductive polymer can be dispersed in a solvent to prepare a composition. Any solvent can be used for the conductive polymer composition as long as it can substantially dissolve the conductive polymer. In illustrative embodiments, solvents useful in the present disclosure can include, but are not limited to, water, alcohol, or mixtures thereof.

The composition may further include other water-soluble or dispersible materials. Depending on the final application of the polymer of the present disclosure, examples of types of additional water-soluble or dispersible materials which can be added include, but are not limited to, polymers, dyes, coating aids, carbon nanotubes, metal nanowires and nanoparticles, organic and inorganic conductive inks and pastes, charge transport materials, piezoelectric, pyroelectric, or ferroelectric oxide nano-particles or polymers, photoconductive oxide nanoparticles or polymers, dispersing agents, and combinations thereof. The materials can be simple molecules or polymers. Examples of other suitable water-soluble or dispersible polymers include, but are not limited to, polyacrylamide, polyvinylalcohol, poly(2-vinylpridine), poly(vinylacetate), poly(vinylmethylether), poly(vinylpyrrolidone), poly(vinylbutyral), poly(styrenesulfonic acid), and conductive polymers such as polythiophenes, polyanilines, polyamines, polypyrroles, polyacetylenes, and combinations thereof.

The polymer of the present disclosure can be employed in the form of blend materials with well-known conductive polymers. In one embodiment, the present composition further comprises poly(3,4-ethylenedioxythiophene)poly(styrenesulfonate) [PEDOT:PSS].

An electrically conductive layer or film formed from the above compositions is also provided. The conductivity of the electrically conductive layer or film may have conductivity in the range of 100 to 1000 S/cm. As mentioned above, the conductivity can be tuned by controlling the ratio of of the repeating unit comprising the hydrophilic side chains in the polymer or the concentration of hydrophilic chains. Such controlling can tune the conductivity in the range of about 100 to 300 S/cm.

The term "layer" or "film" refers to a coating at least partially, or completely covering a desired area and may be used interchangeably. The area can be as large as an entire device or as small as a specific functional area, such as an actual visual display or even a single sub-pixel. The layers or films can be formed by any conventional deposition technique, including vapor deposition and liquid deposition. However, considering the solubility of the present polymer in aqueous solution, liquid deposition would provide more convenience and enable a large patterned layer or film to be fabricated more easily. Typical liquid deposition techniques include, but are not limited to, continuous deposition techniques such as spin coating, gravure coating, curtain coating, dip coating, slot-die coating, spray coating, continuous nozzle coating, and doctor blade coating; and discontinuous deposition techniques such as ink-jet printing, gravure printing, and screen printing.

In one embodiment, a film or layer is formed by applying the composition (which includes the electrically conductive polymer described herein) on a substrate and then allowing or causing at least a portion of the solvent to be removed or otherwise processed to form a structure. The film or layer can be removed from the substrate or remain as a fixed and permanent electrically conductive structure on the substrate. In one embodiment, to form the film or layer, a sufficient amount of solvent may be removed to make the layer or film non-flowable, thereby forming the electrically conductive layer or film. The composition may also be processed using any techniques in the art to remove any portion of the solvent and/or to induce changes in the solvent to form the structure of the film or layer. Examples of suitable techniques for forming the layer or film from a composition deposited on a substrate include heating, polymerization, polymer cross-linking, chemical treatment, and the like. Where heating is used to drive off the solvent, the temperature can be selected to be above the boiling point of the solvent. In one embodiment, the temperature may be greater than about 80° C., or greater than about 100° C., or even greater than about 120° C. In some cases, it can be advantageous to use a relatively volatile solvent to minimize heating needed to remove the solvent. In one embodiment, the temperature is less than 180° C., more specifically less than about 120° C., or less than 100° C. Solvents beyond these temperature ranges may also be used so long as the electrically conductive polymer can maintain its intended function up heating to such a temperature. Moreover, the foregoing maximums and minimums can form the upper and lower end points for ranges of desired temperatures for heating the composition.

The conductive polymer of the present disclosure can be used as an electrode or an electrode buffer layer to increase quantum efficiency. In an organic transistor, the conductive polymer can be used as an electrode material for a gate, a source-drain electrode, and the like. Further, in an electronic device, the conductive polymer compositions can be deposited to form buffer layers. The term "buffer layer" as used herein is intended to mean an electrically conductive or semi-conductive layer which can be used between an anode and an active organic material. A buffer layer is believed to accomplish one or more functions in an organic electronic device, including, but not limited to, planarization of the underlying layer, hole transport, hole injection, scavenging of impurities such as oxygen and metal ions, among other aspects to facilitate or to improve the performance of an organic electronic device.

There are also provided articles including at least one electrically conductive layer formed from the above conductive polymer composition. For example, organic electronic devices that may benefit from having one or more layers made from the composition include, but are not limited to, (1) devices that convert electrical energy into radiation (e.g., a light-emitting diode, light emitting diode displays, liquid crystal displays, electronic paper, touchscreens, or diode lasers), (2) devices that detect signals through electronics processes (e.g., photodetectors, photoconductive cells, photoresistors, photoswitches, phototransistors, phototubes, IR detectors), (3) devices that convert radiation into electrical energy, (e.g., a photovoltaic device or solar cell), and (4) devices that include one or more electronic components that include one or more organic semi-conductor layers (e.g., a transistor or diode). Other uses for the compositions include coating materials for memory storage devices, antistatic films, biosensors, electrochromic devices, solid electrolyte capacitors, energy storage devices such as a rechargeable battery, electromagnetic wave shielding films, window de-icers, heat reflectors, and architectural materials. As mentioned above, the conductivity of electrically conductive layer or film can be tuned by controlling the ratio of the repeating unit comprising the hydrophilic side chains in the polymer or the concentration of hydrophilic chains. If the layers or films have high conductivity, they can be used for OLEDs, solar cells, LCDs and the like. On the other hand, if layers or films have low conductivity, they can be used for electro-optic modulators, microresonators, interferometers, optical switches, directional couplers, multiplexers and the like.

As an example, an organic electroluminescent device employing the composition of a conducting polymer will now be described. The present disclosure will be further made clear from the following example described in detail. However, it is to be understood that the present disclosure is not limited thereto, but may be otherwise variously embodied and practiced.

Those of ordinary skill in the art will appreciate that, for this and other processes and methods disclosed herein, the functions performed in the processes and methods may be implemented in differing order. Furthermore, the outlined steps and operations are provided only as examples, and some of the steps and operations may be optional, combined into fewer steps and operations, or expanded to include additional steps and operations without detracting from the essence of the present disclosure.

EXAMPLE

Example 1

Preparation of an Electrically Conductive Polymer Having Hydrophilic Side Chains An electrically conductive polymer having hydrophilic side chains is prepared as the scheme of FIG. 1.

(1) Synthesis of Compound 2

Calibrated amounts of 2,2'-(3,4-dihydro-2H-thieno[3,4-b][1,4]dioxepine-3,3-diyl)diethanol (compound 1), sodium naphthalene in tetrahydrofuran (THF), and ethylene oxide (EO), each in an ampoule were fitted into a flamed flask and sealed off the vacuum line. 2,2'-(3,4-dihydro-2H-thieno[3,4-b][1,4]dioxepine-3,3-diyl)diethanol and THF were first introduced into the dried flask and then reacted with sodium naphthalene in THF. Then EO was introduced to the flask and polymerized at 40° C. for 3 days. The precipitated macromonomer was collected by filtration.

(2) Synthesis of Compound 3

The compound 2 and acetyl chloride was mixed in dried THF in the presence of sodium hydroxide aqueous solution. The reaction was kept for 6 hr at 50° C. The reaction mixture was poured into n-hexane/ether (1:1 v:v). The precipitates were filtered for the next reaction.

(3) Synthesis of Compound 4

Bromination was performed by conventional method using NBS (N-bromosucciimide) in the presence of acetic acid. The resultant product was purified by re-precipitation in n-hexane.

(4) Synthesis of Compound 5

Deprotection of acetyl group was performed in THF solution with a trace amount of hydrochloric acid solution (0.1 N). Acetyl group was removed to yield compound 5. It was purified by re-precipitation into ether and ethanol.

(5) Synthesis of Compound 6

2-(2-(5-bromothiophen-3-yl)ethoxy)ethanol was dissolved in dried tetrahydrofuran and compound 6 was also dissolved in the mother mixture with a trace amount of lithium diisopropylamide (LDA) at −40° C. (Kumada cross coupling method or Yamamoto coupling method). 1,3-Bis(diphenylphosphino)propane]dichloronickel(II) can be used as a catalyst. The product was poured into ethanol. The solid was filtered to be dried under vacuum for 2 days at 80° C.

Example 2

Preparation of Electrode of Flexible Device Using the Electrically Conductive Polymer Having Hydrophilic Side Chains The resulting polymers of Example 1 are dissolved in water to prepare a polymer composition.

The polymer composition is used as an electrode of a flexible display device. The flexible display device generally comprises an anode layer, a hole injection layer, an electroluminescent layer, a cathode layer, and a flexible organic film. A transparent plastic substrate having good manageability and waterproofness is used as the flexible organic film.

The flexible display device is manufactured using a typical method of preparing display devices, which are not particularly limited. First, an anode layer or cathode layer as a first electrode is formed on the plastic substrate. The first electrode layer is formed by spin coating the above polymer composition on the plastic substrate, then a patterned mask is positioned on the substrate, and the substrate is exposed to about 254 nm of UV light to induce photocrosslinking between cinnamoyl groups in the polymer. Then, the substrate is washed with water to remove the unhardened part of the first electrode layer, thereby obtaining a patterned electrode.

The hole injection layer is formed on the first electrode. The formation of the hole injection layer reduces contact resistance of the first electrode and the electroluminescent layer and improves the electron transport ability of the first electrode to the electroluminescent layer, thereby improving the driving voltage and the lifetime of the electroluminescent device.

The hole injection layer (also referred to as the buffer layer) is formed by spin coating on the first electrode and drying it. Typical conducting polymers employed as buffer layers include polyaniline and polydioxythiophenes such as poly(3,4-ethylenedioxythiophene) (PEDOT). These materials can be prepared by polymerizing aniline or dioxythiophene monomers in aqueous solution in the presence of a water-soluble polymeric acid, such as poly(styrenesulfonic acid) (PSSA), or poly(2-acrylamido-2-methyl-1-propanesulfonic acid) ("PAAMPSA"), as described in, for example, U.S. Pat. No. 5,300,575 and published in PCT application WO 02/065484. A well known PEDOT/PSS material is Baytron®-P, commercially available from H. C. Starck, GmbH (Leverkusen, Germany).

The electroluminescent layer is formed on the hole injection layer. A material for the electroluminescent layer is not particularly limited, but examples thereof include oxadiazole dimer dyes (Bis-DAPDXP), spiro compounds (Spiro-DPVBi, Spiro-6P), triarylamine compounds, bis(styryl)amine (DPVBi, DSA), Firpic, CzTT, Anthracene, TPB, PPCP, DST, TPA, OXD-4, BBOT, AZM-Zn, etc. which are blue materials, Coumarin 6, C545T, Quinacridone, Ir(ppy)$_3$, etc., which are green materials, and DCM1, DCM2, Eu(thenoyltrifluoroacetone)$_3$(Eu(TTA)$_3$), butyl-6-(1,1,7,7-tetramethyljulolidyl-9-enyl)-4H-pyran (DCJTB), etc., which are red materials. In addition, examples of the light-emitting polymer material include polymers such as phenylene, phenylene vinylene, thiophene, fluorene, and spiro-fluorene-based polymers and aromatic compounds containing nitrogen, but are not limited thereto.

The electroluminescent layer forming a composition may further includes a dopant, if desired. The amount of the dopant may vary depending on the material for the electroluminescent layer, but may be generally 30-80 parts by weight based on 100 parts by weight of a material for the electroluminescent layer (total weight of the host and the dopant). When the amount of the dopant is not within this range, the luminous characteristics of an electroluminescent display device are reduced. Examples of the dopant include arylamine, perylenes, pyrroles, hydrazones, carbazoles, stilbenes, starbursts, oxadiazoles and derivatives thereof.

The hole transport layer may be optionally formed between the hole injection layer and the electroluminescent layer.

The material for the hole transport layer is not particularly limited, but may be selected from a compound having a carbazole group and/or an arylamine group, which transport electrons, a phthalocyanine-based compound, and a triphenylene derivative. More particularly, the electron transport layer (HTL) may be composed of at least one material selected from the group consisting of 1,3,5-tricarbazolylbenzene, 4,4'-biscarbazolylbiphenyl, polyvinylcarbazole, m-biscarbazolylbenzene, 4,4'-biscarbazolyl-2,2'-dimethylbiphenyl, 4,4',4''-tri(N-carbazolyl)triphenylamine, 1,3,5-tri(2-carbazolylphenyl)benzene, 1,3,5-tris(2-carbazolyl-5-methoxyphenyl)benzene, bis(4-carbazolylphenyl)silane, N,N'-bis(3-methylphenyl)-N,N'-diphenyl-[1,1-biphenyl]-4,4'-diamine (TPD), N,N'-di(naphthalene-1-yl)-N,N'-diphenyl benzidine (α-NPD), N,N'-diphenyl-N,N'-bis(1-naphthyl)-(1,1'-biphenyl)-4,4'-diamine (NPB), IDE320 (Idemitsu Kosan Co., LTD.), poly(9,9-dioctylfluorene-co-N-(4-butylphenyl)diphenylamine (TFB), and poly(9,9-dioctylfluorene-co-bis-N,N-phenyl-1,4-phenylenediamine) (PFB), but are not limited thereto. The hole blocking layer may be composed of phenanthrolines (e.g., BCP available from UDC), imidazoles, triazoles, oxadiazoles (e.g., PBD), aluminium complex (available from UDC), or BAlq and the like.

Then, the second electrode is formed on the resultant and sealed to complete an organic electroluminescent device. The material for the second electrode is not particularly limited, but may be a metal having a low work function, i.e., Li, Cs, Ba, Ca, Ca/Al, LiF/Ca, LiF/Al, BaF$_2$/Ca, Mg, Ag, Al, or an alloy thereof, or a multilayer thereof.

The organic electroluminescent device of the present disclosure does not require a particular apparatus or method for manufacturing, it and can be manufactured using a conventional manufacturing method.

The present disclosure is not to be limited in terms of the particular examples described in this disclosure. Many modifications and variations can be made without departing from its spirit and scope, as will be apparent to those skilled in the art. Functionally equivalent methods and apparatuses within the scope of the disclosure, in addition to those enumerated herein, will be apparent to those skilled in the art from the foregoing descriptions. Such modifications and variations are intended to fall within the scope of the appended claims. The present disclosure is to be limited only by the terms of the appended claims, along with the full scope of equivalents to which such claims are entitled. It is to be understood that this disclosure is not limited to particular methods, reagents, compounds, or compositions, which can, of course, vary. It is also to be understood that the terminology used herein is for the purpose of describing particular examples only, and is not intended to be limiting.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

As used herein, the terms "comprises," "comprising," "includes," "including," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations. In addition, even if a specific number of an introduced claim recitation is explicitly recited, those skilled in the art will recognize that such recitation should be interpreted to mean at least the recited number (e.g., the bare recitation of "two recitations," without other modifiers, means at least two recitations, or two or more recitations). Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description or claims, should be understood to contemplate the possibilities of including one of the terms, either of the terms, or both terms. For example, the phrase "A or B" will be understood to include the possibilities of "A" or "B" or "A and B."

In addition, where features or aspects of the disclosure are described in terms of Markush groups, those skilled in the art will recognize that the disclosure is also thereby described in terms of any individual member or subgroup of members of the Markush group.

As will be understood by one skilled in the art, for any and all purposes, such as in terms of providing a written description, all ranges disclosed herein also encompass any and all possible subranges and combinations of subranges thereof. Any listed range can be easily recognized as sufficiently describing and enabling the same range being broken down into at least equal halves, thirds, quarters, fifths, tenths, etc. As a non-limiting example, each range discussed herein can be readily broken down into a lower third, middle third and upper third, etc. As will also be understood by one skilled in the art all language such as "up to," "at least," "greater than," "less than," and the like include the number recited and refer to ranges which can be subsequently broken down into subranges as discussed above. Finally, as will be understood by one skilled in the art, a range includes each individual member. Thus, for example, a group having 1-3 cells refers to groups having 1, 2, or 3 cells. Similarly, a group having 1-5 cells refers to groups having 1, 2, 3, 4, or 5 cells, and so forth."

While various aspects and embodiments have been disclosed herein, other aspects and embodiments will be apparent to those skilled in the art. The various aspects and embodiments disclosed herein are for purposes of illustration and are not intended to be limiting, with the true scope and spirit being indicated by the following claims.

The invention claimed is:

1. A method for manufacturing an electrically conductive layer or film of an electronic device, comprising:
forming an intermediate composition comprising a solvent and an electrically conductive polymer, the polymer including n repeating units of Formula 1 and Formula 2:

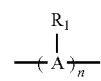

[Formula 1]

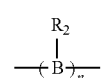

[Formula 2]

wherein,
A and B are independently at least one member selected from the group consisting of phenylene, phenylene vinylene, pyrrolylene, pyrrolylene vinylene, thienylene, thienylene vinylene, fluorenylene, fluorenylene vinylene, furanylene, furanylene vinylene, phenothiazinylene, phenothiazinylene vinylene, phenazinylene, phenazinylene vinylene, phenoxazinylene and phenoxazinylene vinylene, which are unsubstituted or substituted with one or more substituents,
wherein the substituents are independently selected from the group consisting of hydroxyl, alkyl, alkenyl, alkynyl, alkanoyl, alkanoylamino, alkenoyl, alkynoyl, alkoxy, alkoxycarbonyl, alkoxycarbonylamino, alkylamino, alkylamino carbonyl, dialkylaminocarbonyl, alkylsulfonyl, alkylsulfinyl, sulfonylamino alkyl, alkylsulfonylaminocarbonyl, aminoalkyl, cyanoalkyl, halogen, haloalkyl, haloalkenyl, haloalkynyl, haloalkanoyl, haloalkenoyl, haloalkynoyl, haloalkoxy, haloalkoxycarbonyl, hydroxyalkyl, oxoalkyl, cycloalkyl, cycloalkenyl, cycloalkanoyl, cycloalkenoyl, cycloalkoxy, cycloalkoxycarbonyl, aryl, arylene, heterocycle, heterocyclyl, heteroaryl, heteroarylene, arylalkyl, heteroarylalkyl, arylalkanoyl, heteroarylalkanoyl, arylalkenoyl, heteroarylalkenoyl, arylalkynoyl, heteroarylalkynoyl, arylalkoxy, heteroarylalkoxy, aryloxy, heteroaryloxy, aryloxycarbonyl, heteroarylxoycarbonyl, arylalkoxycarbonyl, heteroarylalkoxycarbonyl, alkylhio, alkylthioalkyl, arylthio, arylsulfonyl and arylsulfinyl, or the substituents together form an alkylene or alkenylene chain completing a 3, 4, 5, 6, or 7-membered aromatic or alicyclic ring, whereby said ring optionally includes one or more divalent nitrogen, sulfur or oxygen atoms; and the substituents are substituted or unsubstituted;
$R_1$ represents

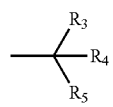

and $R_2$ represents

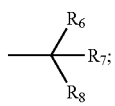

$R_3$, $R_4$, $R_5$, $R_6$, $R_7$ and $R_8$ are independently hydrogen, alkyl, ammonium or

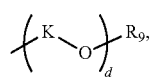

with the proviso that at least one of $R_3$, $R_4$, $R_5$, $R_6$, $R_7$ and $R_8$ is ammonium or

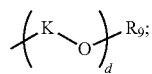

with the additional proviso that $R_1 \neq R_2$;
K represents an alkylene having one or two carbon atoms;
d is 1 to 3;
$R_9$ is hydroxyl, carboxylic acid, sulfonic acid, or a straight or branched alkyl which is unsubstituted or substituted with hydroxyl; and
n represents an integer in a range from about 100 to about 1,000;
applying the intermediate composition to a substrate; and
removing at least a portion of the solvent to yield the electrically conductive layer or film.

2. The method of claim 1, wherein the repeating unit of Formula 1 and the repeating unit of Formula 2 are independently represented by Formula 3, Formula 4, Formula 5, and combinations thereof:

[Formula 3]

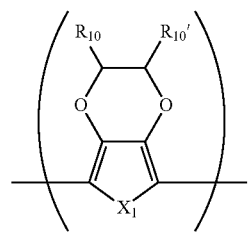

[Formula 4]

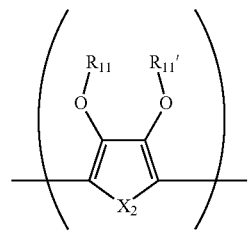

[Formula 5]

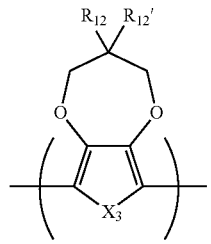

wherein,
$X_1$, $X_2$ and $X_3$ are independently NH, O, S, or PH;
$R_{10}$, $R_{10}'$, $R_{11}$, $R_{11}'$, $R_{12}$ and $R_{12}'$ independently represent

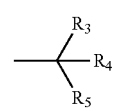

and

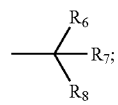

$R_3$, $R_4$, $R_5$, $R_6$, $R_7$ and $R_8$ are independently hydrogen, alkyl, ammonium or

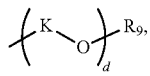

with the proviso that at least one of $R_3$, $R_4$, $R_5$, $R_6$, $R_7$, and $R_8$ is ammonium or

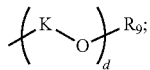

K represents an alkylene having one or two carbon atoms;
d is 1 to 3;
$R_9$ is hydroxyl, carboxylic acid, sulfonic acid, or a straight or branched alkyl which is unsubstituted or substituted with hydroxyl; and
n represents an integer in a range from about 100 to about 1,000.

3. The method of claim 1, wherein the solvent includes water and/or a water soluble alcohol.

4. The method of claim 1, wherein at least a portion of the solvent is removed by evaporation.

5. The method of claim 1, further comprising a water-soluble or dispersible material selected from the group consisting of a polymer, dye, coating aid, carbon nanotubes, metal nanowires, nanoparticles, organic conductive ink or paste, inorganic conductive ink or paste, a charge transport material, a piezoelectric material, a pyroelectric material, ferroelectric oxide nano-particles or polymer, photoconductive oxide nanoparticles or polymer, dispersing agent, and combinations thereof.

6. The method of claim 1, wherein the intermediate composition is patterned on the substrate.

7. The method of claim 1, wherein the electrically conductive film is incorporated into an electrical component of an electronic device selected from the group consisting of light-emitting diodes, light emitting diode displays, liquid crystal displays, electronic paper, touchscreens, diode lasers, photodetectors, photoconductive cells, photoresistors, photoswitches, phototransistors, phototubes, IR detectors, photovoltaic devices, solar cells, transistors, diodes, memory storage devices, antistatic films, biosensors, electrochromic devices, solid electrolyte capacitors, energy storage devices, electromagnetic wave shielding films, window de-icers, heat reflectors, architectural materials, electro-optic modulators, microresonators, interferometers, optical switches, directional couplers and multiplexers.

8. The method of claim 1, wherein the repeating unit of Formula 1 and the repeating unit of Formula 2 are independently represented by Formula 6, Formula 7, and combinations thereof:

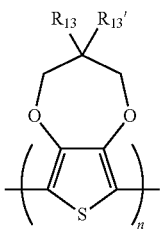

[Formula 6]

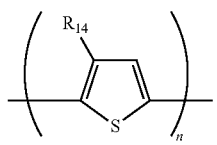

[Formula 7]

wherein,
$R_{13}$, $R_{13'}$ and $R_{14}$ independently represent

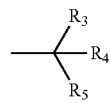

and

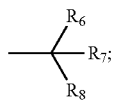

$R_3$, $R_4$, $R_5$, $R_6$, $R_7$ and $R_8$ are independently hydrogen, alkyl, ammonium or

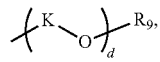

with the proviso that at least one of $R_3$, $R_4$, $R_5$, $R_6$, $R_7$, and $R_8$ is ammonium or

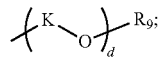

K represents an alkylene having two carbon atoms;
d is 2;
$R_9$ is a hydroxyl, a carboxylic acid, a sulfonic acid, or a straight or branched alkyl which is unsubstituted or substituted with hydroxyl; and
n represents an integer in a range from about 100 to about 1,000.

* * * * *

UNITED STATES PATENT AND TRADEMARK OFFICE
CERTIFICATE OF CORRECTION

PATENT NO. : 8,535,571 B2   Page 1 of 1
APPLICATION NO. : 12/650225
DATED : September 17, 2013
INVENTOR(S) : Choi It is certified that error appears in the above-identified patent and that said Letters Patent is hereby corrected as shown below:

In the Specification,

In Column 7, Line 39, delete ""alkylthio,"" and insert -- "Alkylthio," --, therefor.

In Column 7, Line 42, delete ""arylsulfonyl"" and insert -- "Arylsulfonyl" --, therefor.

In Column 13, Line 5, delete "of of" and insert -- of --, therefor.

In Column 15, Line 15, delete "(N-bromosucciimide)" and insert -- (N-bromosuccinimide) --, therefor.

In Column 16, Line 19, delete "(Bis-DAPDXP)," and insert -- (Bis-DAPOXP), --, therefor.

In the Claims:

In Column 19, Line 28, in Claim 1, delete "alkylhio," and insert -- alkylthio, --, therefor.

Signed and Sealed this
Twenty-fifth Day of March, 2014

Michelle K. Lee
*Deputy Director of the United States Patent and Trademark Office*